(12) United States Patent
Murakami et al.

(10) Patent No.: US 7,375,966 B2
(45) Date of Patent: May 20, 2008

(54) AUTOMATIC TRANSMISSION ELECTRONIC CONTROL DEVICE

(75) Inventors: Naotaka Murakami, Anjo (JP); Hiroyuki Masaki, Anjo (JP)

(73) Assignee: Aisin Aw Co., Ltd. (JP)

( * ) Notice: Subject to any disclaimer, the term of this patent is extended or adjusted under 35 U.S.C. 154(b) by 163 days.

(21) Appl. No.: 11/187,861

(22) Filed: Jul. 25, 2005

(65) Prior Publication Data
US 2006/0023426 A1 Feb. 2, 2006

(30) Foreign Application Priority Data
Jul. 29, 2004 (JP) ............... 2004-222559

(51) Int. Cl.
*H05K 7/20* (2006.01)
(52) U.S. Cl. .............. 361/707; 361/704; 361/709; 257/706
(58) Field of Classification Search ............... None
See application file for complete search history.

(56) References Cited

U.S. PATENT DOCUMENTS

| | | | | |
|---|---|---|---|---|
| 4,409,641 A | * | 10/1983 | Jakob et al. ............ | 361/720 |
| 5,398,160 A | * | 3/1995 | Umeda .................. | 361/707 |
| 5,657,203 A | * | 8/1997 | Hirao et al. ............ | 361/707 |
| 6,160,708 A | * | 12/2000 | Loibl et al. ............ | 361/704 |
| 6,282,092 B1 | * | 8/2001 | Okamoto et al. ........ | 361/704 |
| 6,679,137 B1 | * | 1/2004 | Bek ...................... | 74/606 R |
| 6,724,627 B2 | * | 4/2004 | Onizuka et al. ......... | 361/704 |
| 6,924,985 B2 | * | 8/2005 | Kawakita et al. ....... | 361/715 |
| 7,035,105 B2 | * | 4/2006 | Yamaguchi ............ | 361/707 |
| 7,149,088 B2 | * | 12/2006 | Lin et al. ............... | 361/704 |
| 7,154,753 B2 | * | 12/2006 | Kobayashi ............ | 361/715 |
| 2005/0201069 A1 | * | 9/2005 | Kirigaya ............... | 361/752 |

\* cited by examiner

*Primary Examiner*—Boris L Chervinsky
(74) *Attorney, Agent, or Firm*—Bacon & Thomas, PLLC

(57) ABSTRACT

An ECU has an enclosure which is contained in the casing of an automatic transmission, which is formed of a material having low heat conductivity, and which provides liquid-tight containment of a substrate. A heat sink is attached to the substrate so as to dissipate heat from an electronic circuit on the substrate. The heat sink is attached in contact with an inner wall surface of the enclosure, so that heat produced by the electronic circuit is dissipated via the heat sink and the enclosure.

15 Claims, 6 Drawing Sheets

AUTOMATIC TRANSMISSION ELECTRONIC CONTROL DEVICE

INCORPORATION BY REFERENCE

The disclosure of Japanese Patent Application No. 2004-222559 filed on Jul. 29, 2004 including the specification, drawings and abstract is incorporated herein by reference in its entirety.

BACKGROUND OF THE INVENTION

1. Field of the Invention

The present invention relates to an automatic transmission electronic control device which is attached within a casing of an automatic transmission.

2. Description of the Related Art

A conventionally known automatic transmission electronic control device of the aforementioned type has a substrate which is attached within a casing of an automatic transmission and which includes an electronic circuit for operating the automatic transmission (see Japanese Patent Application Laid-Open Publication No. 2002-12097 (pp. 3-6, and FIGS. 1-8)). The vehicular electronic control device described in this publication has an insulating sheet 24 and, mounted on its upper surface, a control unit 33 that controls the automatic transmission. A protective cover 34 covers the control unit 33 and is supported by bracket 11 which is attached to a control valve 3 contained within an oil pan 2. The bracket 11 is formed by press-working a metal plate or the like. The protective cover 34 is formed of plastic or metal and has a generally box shape opening downward. Thus, the control unit 33 is surrounded by the bracket 11 and the protective cover 34, so as to be protected from the lubricating oil in the automatic transmission. Therefore, short circuit of the control unit 33 due to metal particles formed by wear and the like and present in the lubricating oil is prevented. In some cases, however, immediately after a stop in operation of the automatic transmission, lubricating oil at a temperature raised during operation flows from high-temperature operating mechanisms, such as the torque converter, the oil pump, etc., into the oil pan 2, and therefore rapidly raises the temperature of the electronic control device, resulting in a thermal overshoot. In such a case, the heat is conducted via the bracket 11 having high heat conductivity into the space between the bracket 11 and the protective cover 34 that contains the control unit 33, thus rapidly raising the internal temperature within that space and therefore the temperature of the control unit.

Thus, although the insulating sheet 24 is interposed between the control unit 33 and the bracket 11, the heat of the transmission oil is conducted to the control unit 33, so that the temperature of the control unit 33 may exceed its service condition temperature range, and therefore the electronic control device may fail to operate normally. During operation, the temperature control unit 33 may sometimes become that of the electronic control device. If this situation continues, the temperature of the control unit 33 may exceed its service temperature range, and therefore the electronic control device may fail to operate normally.

SUMMARY OF THE INVENTION

It is an object of the present invention to provide an automatic transmission electronic control device which is able to maintain the temperature of its electronic circuit within its specified service temperature range to the extent possible and therefore maintain reliability at low cost.

Another object of the present invention is to provide a simple structure by which the electronic control device is able to dissipate heat when the temperature of the electronic control device is higher than the ambient temperature, and to provide a heat insulating effect when the ambient temperature rapidly becomes higher than the temperature in the electronic control device due to a thermal overshoot.

In an automatic transmission electronic control device in accordance with a first aspect of the present invention, a substrate provided with an electronic circuit for controlling an automatic transmission is contained in a liquid-tight enclosure formed of a material having a low heat conductivity, wherein the enclosure has a structure that dissipates the heat produced by the electronic circuit. Therefore, during operation of the automatic transmission, if the temperature of the electronic circuit becomes higher than the ambient temperature of the area surrounding the electronic control device (temperature inside of the casing), heat produced by the electronic circuit is dissipated via the enclosure so as to minimize the rise in the temperature of the electronic circuit and to prevent it from exceeding its service temperature range. Immediately after operation of the automatic transmission is stopped, the operating fluid, at a temperature which has become higher than that during operation, flows in from mechanisms operated at a high-temperature, such as torque converter, oil pump, etc., and therefore rapidly raises the temperature of the electronic control device, resulting in a thermal overshoot. Any thermal overshoot is absorbed by the enclosure, having a low heat conductivity, to curb the rapid rise in the temperature of the electronic circuit which would otherwise occur and to prevent its temperature from exceeding the service temperature range. Therefore, reliability can be maintained at low cost with a simple structure by maintaining the temperature of the electronic circuit within the conventional service temperature range to the extent possible.

In a second aspect of the invention, the electronic control device further includes a heat dissipating member that is attached to the substrate and to the inner wall surface of the enclosure, so as to dissipate heat from the electronic circuit via the enclosure. Therefore, with a simple structure, the electronic control device is able to dissipate heat produced by the electronic circuit to the operating fluid in the casing, via the enclosure.

In a third aspect of the invention, the electronic control device is structured so as to dissipate heat produced by the electronic circuit, via the enclosure, by use of a metal substrate, that has a heat dissipating characteristic, attached to an inner wall surface of the enclosure. Therefore, such an embodiment, with an even simpler structure, is able to dissipate heat produced by the electronic circuit to the operating fluid in the casing, via the enclosure.

In a fourth aspect of the invention, a space (gap) is formed between the heat dissipating member and an attachment surface on the enclosure. Therefore, heat of the heat dissipating member is dissipated to the space, as well as to the enclosure. Hence, heat can be more efficiently dissipated from the electronic circuit when the temperature of the electronic circuit is higher than the ambient temperature. On the other hand, although heat of the enclosure is conducted to the electronic circuit via the heat dissipating member, heat insulation is provided by the space. Therefore, the electronic circuit can be more effectively insulated from heat when the ambient temperature around the electronic control device rapidly rises and results in a thermal overshoot.

In a fifth aspect of the invention, the heat dissipating member is insert-molded in an attachment surface on the enclosure. Therefore, the labor and cost needed to attach the heat dissipating member to the enclosure can be reduced.

In a sixth aspect of the invention, the heat dissipating member is fixed to an attachment surface on the enclosure via a member formed of a material having low heat conductivity. Therefore, in the case where the ambient temperature around the electronic control device rapidly rises and results in a thermal overshoot, the heat conduction from the enclosure to the heat dissipating member can be reduced so as to more effectively insulate the substrate from heat.

In a seventh aspect of the invention, the heat dissipating member is adhered to an attachment surface on the enclosure via an adhesive having low heat conductivity. Therefore, it is possible to easily fix the heat dissipating member to the enclosure while maintaining low heat conduction from the enclosure to the heat dissipating member.

In a eighth aspect of the invention, the enclosure is disposed at a position that is thermally isolated from a high-temperature operating mechanism heating portion of the automatic transmission. Therefore, it is possible to substantially prevent rapid rise in the ambient temperature around the electronic control device and therefore occurrence of a thermal overshoot. Thus, the overheating of the outer periphery of the enclosure can be mitigated.

In an electronic control device in accordance with an eleventh aspect of the invention, a substrate provided with an electronic circuit for controlling an automatic transmission is attached in a casing with the substrate contained in a liquid-tight enclosure, which enclosure has a heat conductivity lower than the heat conductivity of a heat dissipating portion, and heat produced by the electronic circuit is dissipated via the enclosure. Therefore, in the case where, during operation of the automatic transmission, the temperature of the electronic circuit rises to be higher than the ambient temperature around the electronic control device, that is, the internal temperature of the casing, heat produced by the electronic circuit is dissipated via the enclosure so as to curb rises in the temperature of the electronic circuit and to prevent it from exceeding its service condition temperature range. On the other hand, in the case where, immediately after operation of the automatic transmission is stopped, the operating fluid, at a temperature higher than that during operation, flows in from high-temperature operating mechanisms, such as a torque converter, an oil pump, etc., and therefore rapidly raises the ambient temperature around the electronic control device and results in a thermal overshoot, the thermal overshoot is absorbed by the enclosure so that a rapid rise in the temperature of the electronic circuit is curbed and the service temperature range is not exceeded. Therefore, reliability can be maintained at low cost with a simple structure by maintaining the temperature of the electronic circuit within the conventional service condition temperature range to the extent possible.

DETAILED DESCRIPTION OF THE PREFERRED EMBODIMENTS

First Embodiment

Figure 1:
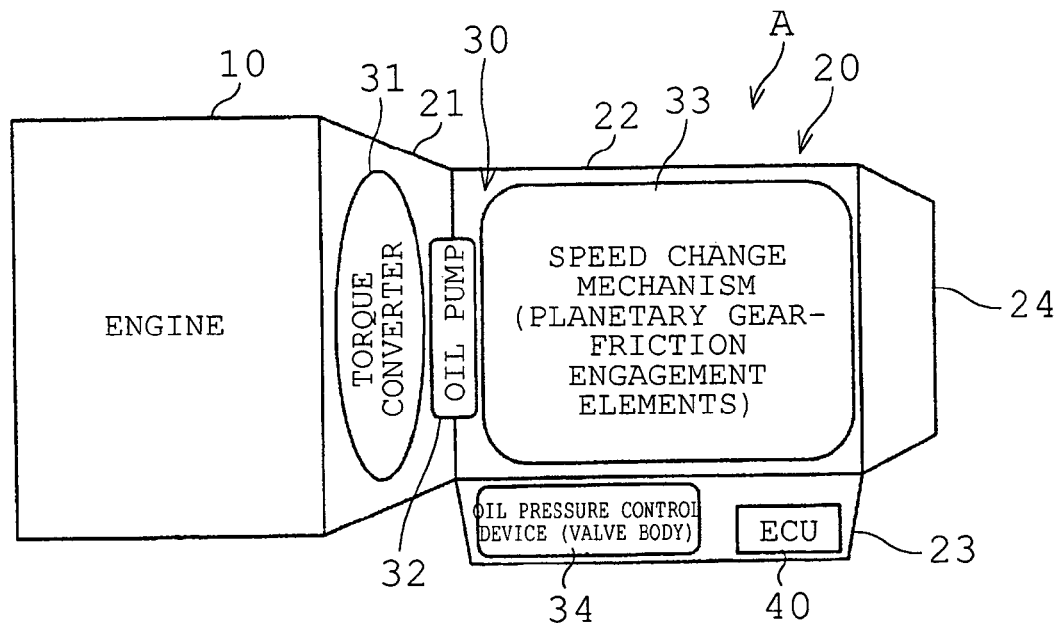
FIG. 1 is a schematic diagram of an automatic transmission equipped with an automatic transmission electronic control device of a first embodiment of the present invention.

An automatic transmission A equipped with an automatic transmission electronic control device of a first embodiment of the present invention will be described hereinafter with reference to the drawings. FIG. 1 shows the automatic transmission A which changes the speed of the output of an engine 10 mounted in a vehicle, and transfers power to driving wheels. In this embodiment, the automatic transmission A is a FR (front engine, rear drive) vehicle automatic transmission, and is located at the rear of the engine 10. The present invention is also applicable to a FF (front engine, front drive) vehicle automatic transmission.

The automatic transmission A is provided with a casing 20 that houses an operating mechanism 30. Automatic Transmission Fluid (ATF or AT), is utilized by the operating mechanism 30.

The operating mechanism 30 includes a torque converter 31, an oil pump 32, a speed change mechanism 33, and an oil pressure control device (valve body) 34. The torque converter 31, housed within a torque converter housing 21, is filled with ATF for transfer of power from the engine 10 to a speed change mechanism 33 utilizing a turbine driven by a pump impeller by force of the ATF. Generally, during operation of the torque converter, the operating fluid (ATF) rotates relative to the torque converter, and that relative raises the temperature of the operating fluid to a high level.

The speed change mechanism 33 is housed within a gear case 22 and is made up of a planetary gear set and friction engagement elements (clutches, brakes), so as to input the power of the engine 10 via an input shaft (not shown), and output power via an output shaft (not shown). The speed change mechanism 33 is designed to provide various speed stages (e.g., four forward speeds and one reverse speed) for the automatic transmission through combinations of engagement and disengagement of the clutches and the brakes.

An oil pan 23 is attached to a lower portion of the gear case 22 for receiving and holding the ATF flowing down from the torque converter 31, the oil pump 32 and the speed change mechanism 33.

The oil pump 32 operates in association with the engine 10 and is driven by the engine 10 to suck the ATF from the oil pan 23 and pump it out to a hydraulic control device 34. The oil pump 32 is disposed near the junction between the torque converter housing 21 and the gear case 22.

The hydraulic control device 34 has oil passageways in which a plurality of electromagnetic valves (not shown) are disposed. Through control of the electromagnetic valves, the oil pressure supplied from the oil pump 32 is adjusted, and the adjusted oil pressure is supplied to the clutches, the brakes and the torque converter 31. The hydraulic controller 34 is attached to the gear case 22, and is contained within the oil pan 23. Each of the electromagnetic valves has a drain and, when the oil pressure supplied to a corresponding clutch, brake or the like is to be discharged, the corresponding oil passageway is connected to the drain.

The casing 20 is made up of the torque converter housing 21, the gear case 22 and the oil pan 23 described above, as well as a differential case 24 attached to a rear portion of the gear case 22, which are in communication with each other inside the casing 20.

An ECU (electronic control unit) 40 is attached within the casing 20. The ECU 40 is an automatic transmission electronic control device that controls operation of the automatic transmission A by controlling the electromagnetic valves of the hydraulic control device 34. In this embodiment, the ECU 40 is contained in the oil pan 23, and is attached to the gear case 22. It is preferable that the ECU 40 be disposed adjacent the hydraulic control device 34 because the cable for electrically connecting the ECU 40 and the hydraulic control device 34 can be shortened. It is also preferable that the ECU 40 be disposed at a position that is thermally isolated from the torque converter 31 and the oil pump 32, which are high-temperature operating portions of the automatic transmission A. Therefore, it is preferred that the ECU 40 be disposed in a position spaced from the high-temperature operating mechanisms, for example, in a position in the rear of the oil pan 23, or with a another portion, for example, the speed change mechanism 33, intervening between the ECU 40 and the high-temperature operating portions of the automatic transmission A.

Figure 2:
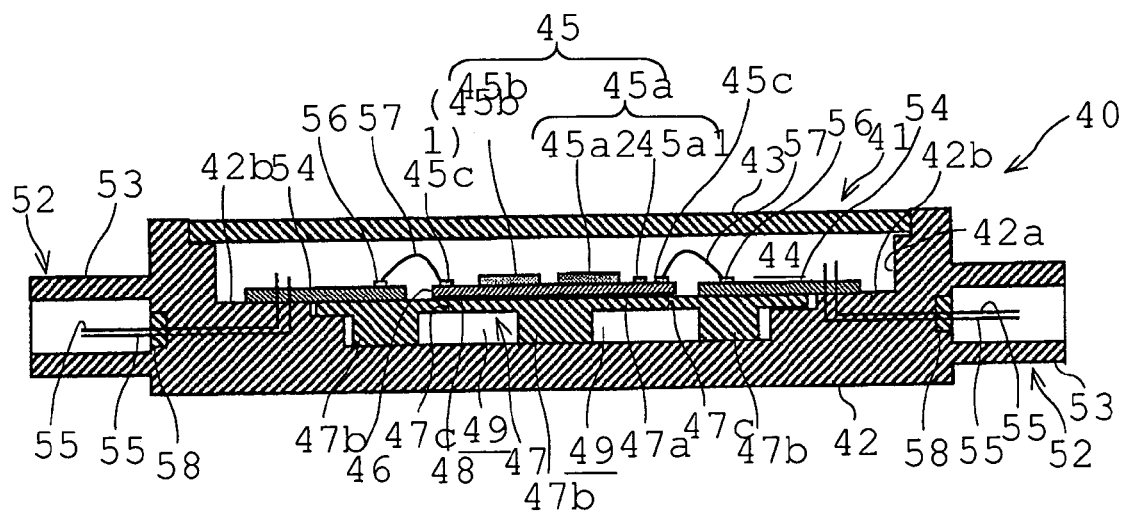
FIG. 2 is a sectional view of the automatic transmission electronic control device of the first embodiment of the present invention.

The ECU 40 is housed within an enclosure 41 as shown in FIG. 2. The enclosure 41 has a body 42 of a box shape with an upper opening, and a cover 43 that closes the upper opening. The cover 43 is secured to the body 42 by welding or adhesion. A recess 42a within the body 42 in combination with cover 43, forms a liquid-tight housing chamber 44 containing a substrate 46 (described later). The body 42 and the cover 43 are formed of a material having a low heat conductivity, preferably, a heat-resistant resin, e.g., a silicon-based resin. The heat conductivity of the enclosure 41 should be lower than the heat conductivity of the heat sink 47 that serves as a heat dissipating member.

A substrate 46 with an electronic circuit 45, for controlling the automatic transmission A by operating the electromagnetic valves of the oil pressure control device 34, is attached to the bottom of the recess 42a via the heat sink 47.

The electronic circuit 45 includes an electromagnetic valve drive circuit 45a that controls current to the electromagnetic valves of the oil pressure control device 34 for opening and closing, and a control circuit 45b that sends a control signal to the electromagnetic valve drive circuit 45a so as to control the opening and closing of the electromagnetic valves. The electromagnetic valve drive circuit 45a is made up of switching elements 45a1 (e.g., FETs, transistors) for operation of the respective individual electromagnetic valves, and a drive circuit 45a2 for switching between the ON (energized) and OFF (non-energized) states of the switching elements 45a1. The control circuit 45b has a CPU 45b1 that sends to the drive circuit 45a2 control signals for the electromagnetic valves so as to control the opening and closing of the electromagnetic valves.

The substrate 46 is formed of a ceramic that is a good heat dissipating material, and an upper surface (and/or a lower surface) on which the electronic circuit 45 is formed. The substrate 46 is fixed to an upper surface of the heat sink 47 by an adhesive 48.

The heat sink 47 is attached in contact with the inner, bottom wall surface of the recess 42a. Therefore, heat produced by the electronic circuit 45, particularly heat from the CPU 45b1 and the switching elements 45a1 which produce a considerable amount of heat during operation, is dissipated via the enclosure 41, particularly, the body 42.

More specifically, the heat sink 47 has a flat plate shape portion 47a which supports the substrate 46 on its upper surface, and a plurality of protrusions 47b which are formed integrally with the plate-shaped portion 47a and are spaced apart with intervals therebetween. The protrusions 47b support the heat sink 47 relative to the enclosure 41, with a lower surface of each protrusion portion 47b contacting the bottom surface of the recess 42a, and provide a maximum surface area for enhancing the heat dissipating effect. Spaces 49 are formed between the internal bottom surface of the recess 42a and recesses 47c formed between the protrusions 47b. The spaces 49 are open to the housing chamber 44. Gas circulates by convection within the enclosure 41, including in the space above the heat sink 47, in the spaces 49, and between the space above the heat sink 47 and the spaces 49. Therefore, when the temperature of the heat sink 47 is higher than the temperature within the spaces 49, heat is released from the heat sink 47 to the gas in the spaces 49, so that the temperature of the heat sink 47 drops. As the temperature within the spaces 49 rises, the temperature in the enclosure 41 also rises due to convection of the gas in the enclosure 41 and, finally, the temperature of the heat sink 47 (or the temperature of the high-temperature operation electronic components) reaches thermal saturation. Although in this embodiment, air is the gas in the enclosure 41, a gas other than air may also be contained therein. Furthermore, the space in the enclosure 41 may be evacuated in order to further improve thermal insulation. In this latter case, however, the heat dissipation by the heat sink 47 decreases.

Figure 3:
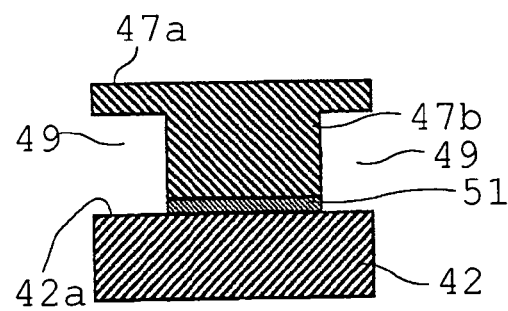
FIG. 3 is an enlarged fragmentary sectional view of the attachment of a heat sink to an attachment surface on an enclosure of the automatic transmission electronic control device of the first embodiment of the present invention.

As shown in FIG. 3, the protrusions 47b of the heat sink 47 are fixed to the bottom wall surface of the recess 42a by an adhesive 51 that has low heat conductivity. As used herein "contact" between the heat sink 47 (or the metal substrate 154, or the substrate 246) and the inner (or "bottom") wall surface of the enclosure 41. It is intended to include both embodiments wherein the body 42 of the enclosure 41 is joined to the heat sink 47 (or a metal substrate 154, or a substrate 246) via adhesive 51 and embodiments wherein the body 42 of the enclosure 41 is directly joined to the heat sink 47 (or the metal substrate 154, or the substrate 246).

A housing 53 for a connector 52 may be formed integrally with the body 42 of the enclosure 41. This connector 52 is, for example, a connector of a harness electrically connected to the electromagnetic valves of the oil pressure control device 34, or a connector of a harness connected to an electric power source (DC power source) that supplies voltage to the ECU 40. The connector 52 has a plurality of pins (leads) 55 each of which is electrically connected at one end to a relay substrate 54 (by soldering or the like), and protrudes at the other end into the housing 53. Each pin 44 is formed in a letter-L shape, and an intermediate portion thereof is embedded in the body 42.

The relay substrate 54 is formed as a flat plate of an insulating material, for example, a glass epoxy. The relay substrate 54 is contained in the housing chamber 44, and is disposed astride an upper surface of a step 42b within the recess 42a of the body 42 and an upper surface of an end portion of the heat sink 47, and is attached and secured thereto by an adhesive. The upper surface of the relay substrate 54 is provided with a pattern (e.g., a copper foil pattern) which is connected, at one end thereof, to the pins 55 by soldering. Another end side of the pattern has pads 56. Each pad 56 is electrically connected via a wire 57 (joined by wire bonding) to a corresponding pad 45c provided at an end of one of the patterns formed on the upper surface of the substrate 46. Another end of each pattern on the upper surface of the substrate 46 is connected to the electromagnetic valve drive circuit 45a or the control circuit 45b. Therefore, the pins 55 and the electronic circuit 45 of the substrate 46 are electrically connected via the relay substrate 54. As for the method for electrically connecting the pads 56 of the relay substrate 54 and the pads 45c of the substrate 46, it is also possible to adopt a jumper lead junction in which the connection is accomplished via jumper leads, instead of the foregoing wire bonding junction. It is also possible to use an anisotropic electrical conductive adhesive to make such connections. In this case, it is preferable that the relay substrate 54 and the substrate 46 be arranged so that the pads 56 and the pads 45c will face each other to facilitate making the connections. Furthermore, it is also possible to join the pins 55 directly to the pads 45c of the substrate 46 without providing the relay substrate 54. In this latter case, it is preferable to form, at one end of the pins 55, a mechanism for clamping an end portion of the substrate 46 including the pads 45c.

Figure 4:
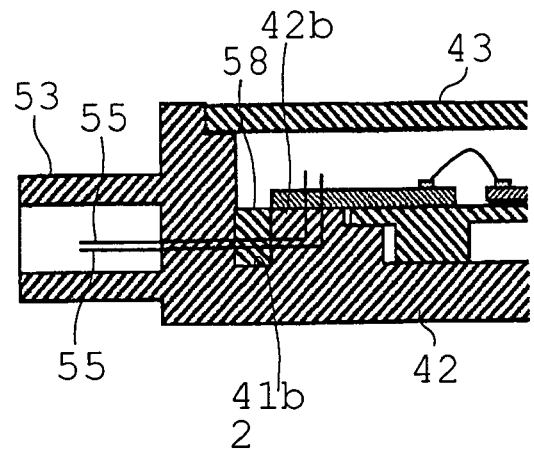
FIG. 4 is an enlarged fragmentary sectional view of a seal structure for pins of a connector of the automatic transmission electronic control device of the first embodiment of the present invention.
Figure 5:
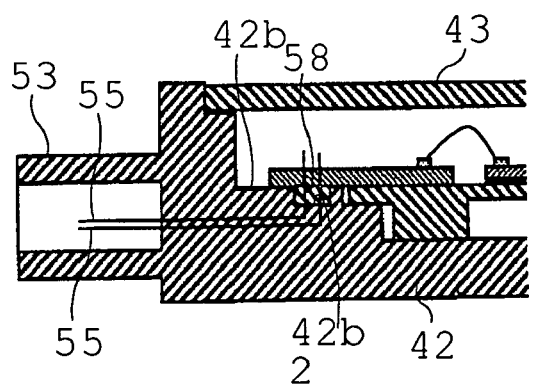
FIG. 5 is an enlarged fragmentary sectional view of another seal structure for pins of a connector of the automatic transmission electronic control device of the first embodiment of the present invention.
Figure 6:
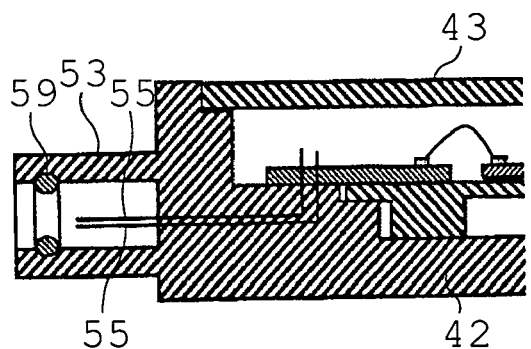
FIG. 6 is an enlarged fragmentary sectional view of still another seal structure for pins of a connector of the automatic transmission electronic control device of the first embodiment of the present invention.

The pins 55 of the connector 52 are sealed from the ATF by a potting material 58 that is charged deep inside the connector 52. Examples of the potting material include silicon-based materials, and epoxy-based materials. For example, as shown in FIG. 4, the potting material 58 may be charged into a recess 42b1 that is formed in the step 42b of the body 42, so as to seal the pins 55 and therefore the connector 52. Alternatively, the potting material 58 may be charged into a recess 42b2 formed in the upper surface of the step portion 42b, so as to seal the pins 55 and therefore the connector 52, as shown in FIG. 5, Another method for sealing the connector 52 is shown FIG. 6, where an annular seal member (seal ring) 59 is provided around an inner peripheral surface of the housing 53 of the connector 52 in such a fashion that when the cable connector is inserted into to the connector 52, the connector 52 is sealed by the seal member 59.

In operation of the automatic transmission A when the temperature of the electronic circuit 45 rises to a temperature higher than the temperature of the ECU 40, i.e. the temperature of the casing interior 20, heat produced by the electronic circuit 45 dissipates via the substrate 46, the adhesive 48, the heat sink 47, the adhesive 51, and the body 42 of the enclosure 41, so as to prevent the temperature of the electronic circuit 45 from exceeding the service temperature range. Heat of the heat sink 47 is released to the spaces 49 as well as to the enclosure 41. Therefore, when the temperature of the electronic circuit 45 is higher than the ambient temperature, heat of the electronic circuit can be more efficiently dissipated.

Furthermore, in some cases, immediately after the engine 10 is turned off and the automatic transmission A stops operating, the ATF whose temperature has risen to become higher than its temperature during operation collects, flowing in from high-temperature operating components, such as the torque converter 31, the oil pump 32, etc., and therefore rapidly raises the ambient temperature of the ECU 40, resulting in a thermal overshoot. However, since the substrate 46 and the electronic circuit 45 are surrounded by the enclosure 41 that is formed of a material having low heat conductivity, the thermal overshoot is absorbed by the enclosure 41 so as to prevent a rapid rise in the temperature of the substrate 46 and therefore prevent a rapid rise in the temperature of the electronic circuit 45. Although heat of the ATF is conducted to the electronic circuit 45 via the enclosure 41, the adhesive 51, the heat sink 47, the adhesive 48 and the substrate 46, heat insulation is provided by the spaces 49. Therefore, the electronic circuit 45 can be more effectively insulated from heat when the ambient temperature of the electronic control device rapidly rises and results in a thermal overshoot.

As is apparent from the foregoing description, in this embodiment, the substrate 46, which supports the electronic circuit 45 for operating the automatic transmission A, is mounted in the casing 20 so that it is contained liquid-tight in the enclosure 41 and is formed of a material having a low heat conductivity, so that heat produced by the electronic circuit can be dissipated to the operating fluid (ATF) present in the casing 20, via the heat sink 47 and the enclosure 41.

This embodiment makes it possible to easily fix the heat sink 47 to the enclosure 41 (body 42) while minimizing heat conduction from the enclosure 41, i.e., to the bottom surface of the recess 42a, while minimizing heat conduction from the enclosure 41 (body 42) to the heat sink 47.

Furthermore, since the enclosure 41 is disposed at a position that is thermally isolated from the high-temperature operating portions of the automatic transmission A, it is possible to substantially prevent rapid rises in the ambient temperature of the ECU 40 and therefore occurrence of thermal overshoot. Thus, the overheating of the exterior of the enclosure 41 can be mitigated.

In the first embodiment, the heat sink 47 is provided with protrusions and recesses, and the bottom surface of the recess 42a of the body 42 is flat. Lower surfaces of the protrusions 47b of the heat sink 47 are in contact with the flat bottom surface, so as to form spaces 49 therebetween. However, it is also possible to form spaces 49 by making lower surface of the heat sink 47 flat, and forming protrusions and recesses in the bottom surface of the recess 42a and placing the lower surface of the heat sink 47 in contact with the upper surfaces of the protrusions.

Furthermore, although, in the first embodiment, the heat sink 47 is fixed to the bottom surface of the recess 42a of the body 42 via the adhesive 51, the heat sink 47 may also be fixed, via an element formed of a material having low heat conductivity. This also makes it possible to reduce the heat conduction from the enclosure 41 to the heat sink 47 so as to more effectively insulate the substrate 46 (and therefore the electronic circuit 45) from heat when the ambient temperature of the ECU 40 rises rapidly and results in a thermal overshoot.

Second Embodiment

Figure 7:
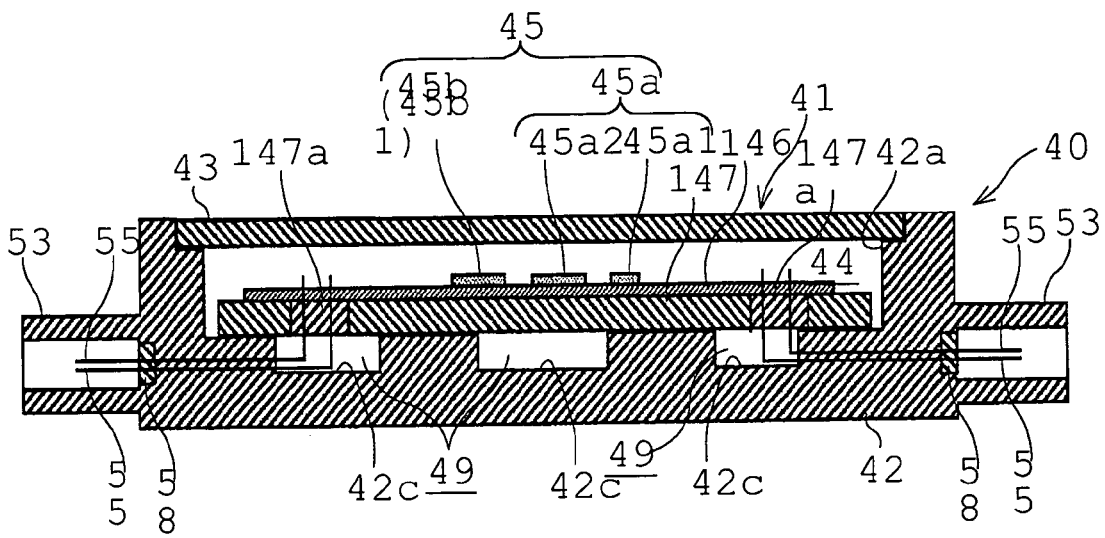
FIG. 7 is a sectional view of an automatic transmission electronic control device of a second embodiment of the present invention.
Figure 8:
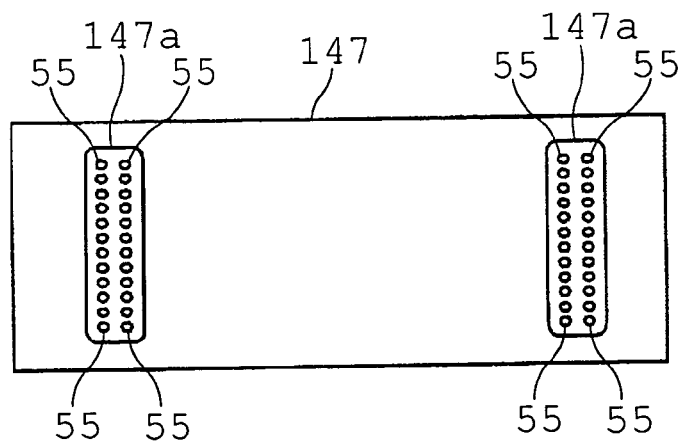
FIG. 8 is a top view of the heat sink shown in FIG. 7.

Next, an automatic transmission electronic control device in accordance with a second embodiment of the present invention will be described with reference to FIGS. 7 and 8. While in the first embodiment the substrate 46 and the relay substrate 54 are separate members, the second embodiment includes a substrate 146 in which the substrate 46 and the relay substrate 54 are integrated. Other features of the second embodiment that are substantially the same as those of the first embodiment are represented by the same reference numerals, and the description thereof will not be repeated and only those feature different from the first embodiment will be described.

The substrate 146 is formed of a glass epoxy. As in the substrate 46, an upper surface of the substrate 146 has an electronic circuit 45 formed thereon. Pins 55 are soldered to the upper surface of the substrate 146 and the electronic circuit 45 and the pins 55 are electrically connected by a pattern disposed on the upper surface of the substrate 146.

The heat sink 147 lacks protrusions 47b of the heat sink 47, and is formed only by a mount portion 47a. The heat sink 147 is formed so as to be broader than the substrate 146 to allow for tight-contact between the substrate 146 and the upper surface of the heat sink 147 on which it is mounted. It is preferable that the substrate 146 be adhered to the heat sink 147 by an insulating adhesive. The heat sink 147 as described above is attached in contact with the bottom surface of the recess 42a in which recesses 42c are formed. It is preferable that the heat sink 147 be adhered to the bottom surface of the recess 42a (the attachment surface on the enclosure 41) by an insulating adhesive. The recesses 42c and the heat sink 147 define spaces 49 therebetween. Insulating members 147a are pressed into through holes in the heat sink 147, and have pins 55 extending through (penetrating) insulating members 147a. Therefore, the second embodiment achieves a cost reduction due to the integration of the substrate 146, in addition to providing the features and advantages of the first embodiment.

Third Embodiment

Figure 9:
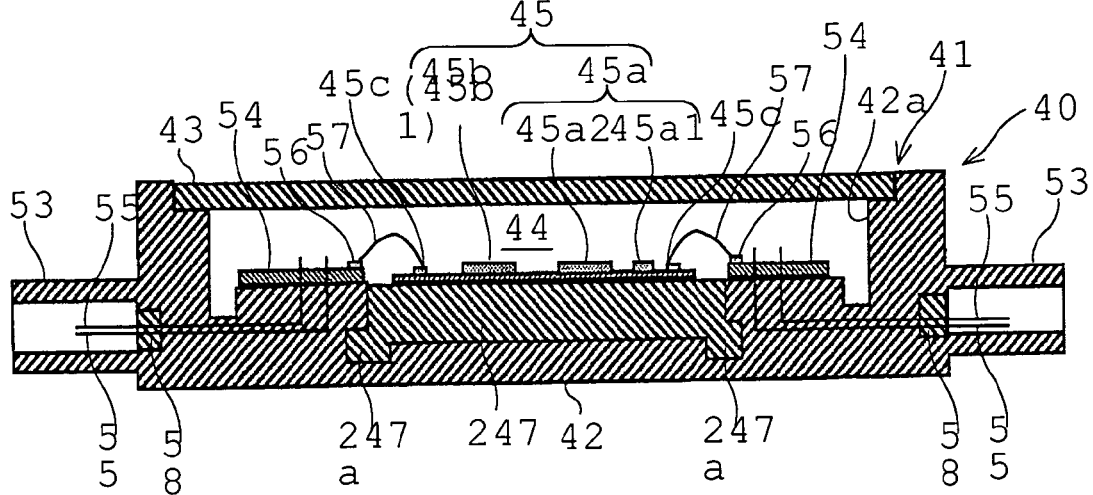
FIG. 9 is a sectional view of an automatic transmission electronic control device of a third embodiment of the present invention.

Next, an automatic transmission electronic control device in accordance with a third embodiment of the present invention will be described with reference to FIG. 9. While in the first embodiment, the heat sink 47 is in contact with the bottom surface of the recess 42a of the body 42, and is adhered thereto by the adhesive 51, the third embodiment adopts a structure in which a heat sink 247 is insert-molded in the bottom surface of the recess 42a. In this case, the heat sink 247 is provided with protrusions 247a for securing the heat sink 247 within the case body 42. Incidentally, portions of the third embodiment that are substantially the same as those of the first embodiment are represented by the same reference numerals, and only those features which are different will be described here. This embodiment reduces the cost and labor involved in attaching the heat sink 247 to the enclosure 41.

Fourth Embodiment

Figure 10:
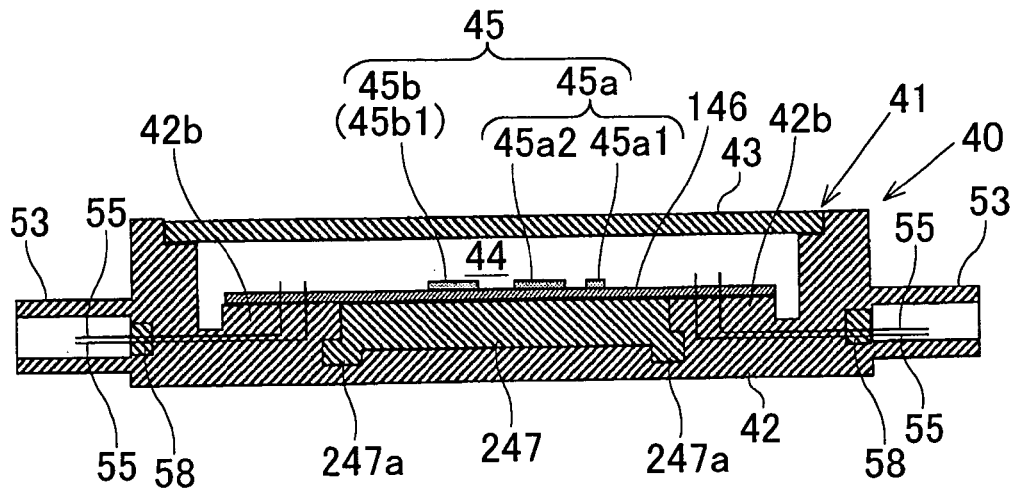
FIG. 10 is a sectional view of an automatic transmission electronic control device of a fourth embodiment of the present invention.

Next, an automatic transmission electronic control device in accordance with a fourth embodiment of the present invention will be described with reference to FIG. 10. Similar to the third embodiment, this fourth embodiment has the heat sink 247 insert-molded into the bottom surface of the recess 42a. The fourth embodiment differs from the third embodiment in that, in place of the substrate 46 and the relay substrate 54, a substrate 146 as described in connection with the second embodiment is disposed astride an upper surface of a step 42b and an upper surface of the heat sink 247, flush with the upper surface of the step portion 42b, and is attached and secured to both upper surfaces by, for example, an adhesive. Incidentally, features of the fourth embodiment that are substantially the same as those of the third or second embodiment are represented by the same reference numerals, and only those features which are different will be described. This embodiment reduces the cost and labor required to attach the heat sink 247 to the enclosure 41.

In the third and fourth embodiments, the heat sink 247 may also be adhered, via a member (e.g., a thin sheet-like member) formed of a material having low heat conductivity, to its attachment surface, i.e., the bottom surface of the recess 42a. This embodiment makes it possible to easily fix the enclosure 41 (body 42) to the heat sink 247 while maintaining small low conductivity from the enclosure 41, in particular, from the body 42 to the heat sink 247.

Fifth Embodiment

Figure 11:
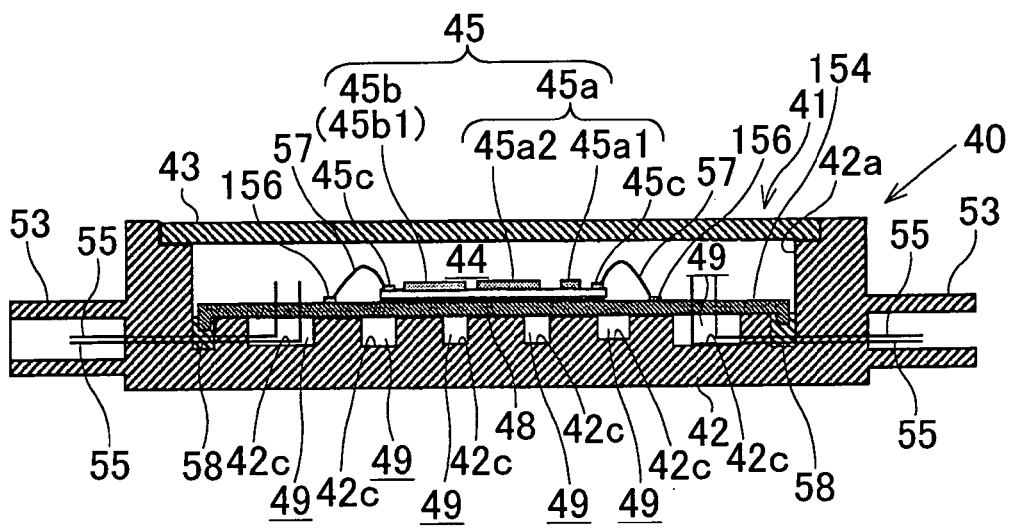
FIG. 11 is a sectional view of an automatic transmission electronic control device of a fifth embodiment of the present invention.
Figure 12:
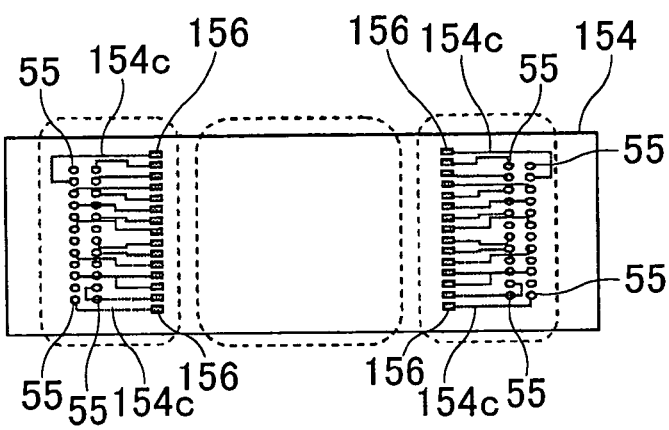
FIG. 12 is a top view of the metal substrate shown in FIG. 11.

Next, an automatic transmission electronic control device in accordance with a fifth embodiment of the present invention will be described with reference to FIGS. 11 to 13. While in the first embodiment, a conductive pattern on the relay substrate 54 is provided for electrically connecting the electronic circuit 45 of the substrate 46 to the pins 55 of the connector 52, the fifth embodiment employs a metal substrate 154 instead of the conductive pattern on relay substrate 54. The metal substrate 154 is a widely known metal substrate, for example, aluminum. Therefore, this substrate has good heat conductivity and a good heat dissipating characteristic, and thus functions also as a heat dissipating member. Therefore, in the fifth embodiment, the separate heat sink 47 is omitted.

Figure 13:
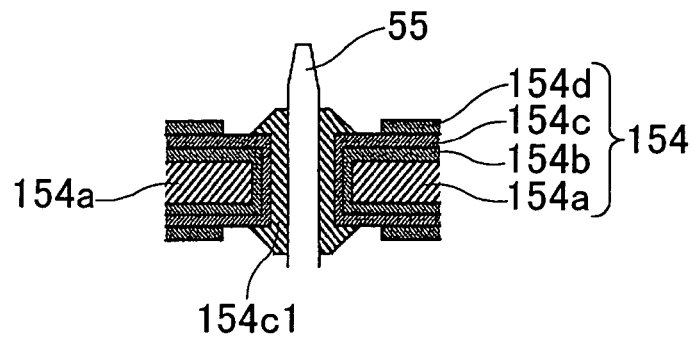
FIG. 13 is an enlarged fragmentary sectional view of a portion where a pin is joined to the metal substrate shown in FIG. 11.

The metal substrate 154, as shown in FIG. 13, includes an insulating layer 154b formed on an upper and/or lower surface of a metal base 154a, and a pattern 154c is formed on a surface of the insulating layer 154b, and another insulating layer 154d is formed on the pattern 154c. The pattern 154c, similar to the pattern of the relay substrate 54, is connected at one end to pads 156 which, in turn, are connected to pads 45c via wires 57. Another end of the pattern extends to through-holes 154c1 into which pins 55 are inserted. Each of two opposing end portions of the upper surface of the metal substrate 154 have the pattern 154c corresponding to the relay substrate 54. A substrate 46 is fixed to a central portion of the upper surface of the metal substrate 154 by an adhesive 48.

The metal substrate 154 is mounted in contact with the bottom surface of recess 42a. It is preferred that the metal substrate 154 be adhered to the bottom surface of the recess 42a (the attachment surface on the enclosure 41) by an insulating adhesive. The bottom surface of the recess 42a of the body 42 is, in turn, provided with recesses 42c. The recesses 42c and the metal substrate 154 define spaces 49 therebetween. The pins 55 are soldered within the through-holes 154c1. The heat conductivity of the enclosure 41 is lower than the heat conductivity of the metal substrate 154 which serves as a heat dissipating element.

According to the fifth embodiment, the substrate 46, which supports the electronic circuit 45 for operating the automatic transmission A, is mounted within the casing 20 and is sealed liquid-tight in the enclosure 41 formed of a material having low heat conductivity, and heat produced by the electronic circuit 45 is dissipated via the metal substrate 154 and the enclosure 41 (body 42). Therefore, in the case where, during operation of the automatic transmission A, the temperature of the electronic circuit 45 rises to a temperature higher than that of the ECU 40, that is higher then the temperature of the casing 20 interior, heat produced by the electronic circuit 45 is dissipated via the metal substrate 154 and the enclosure 41 so as to curb rise in the temperature of the electronic circuit 45 and prevent it from exceeding the service temperature range. On the other hand, in the case where, immediately after operation of the automatic transmission A is stopped, the operating fluid (ATF) whose temperature has become higher than its operating temperature flows in from the high-temperature operating components, such as the torque converter 31, the oil pump 32, etc., and therefore would otherwise rapidly raise the temperature of the ECU 40 and result in a thermal overshoot, the thermal overshoot is absorbed by the enclosure 41 so that a rapid rise in the temperature of the electronic circuit 45 is curbed and temperatures in excess of the service temperature range are prevented, since the electronic circuit 45 is surrounded by the enclosure 41 formed of a material having low heat conductivity. Therefore, reliability can be maintained at low cost with a simple structure by maintaining the temperature of the electronic circuit 45 within the specified service temperature range to the extent possible.

Furthermore, the use of the metal substrate 154 eliminates the need for a separate heat sink, and thus allows a cost reduction.

Sixth Embodiment

Figure 14:
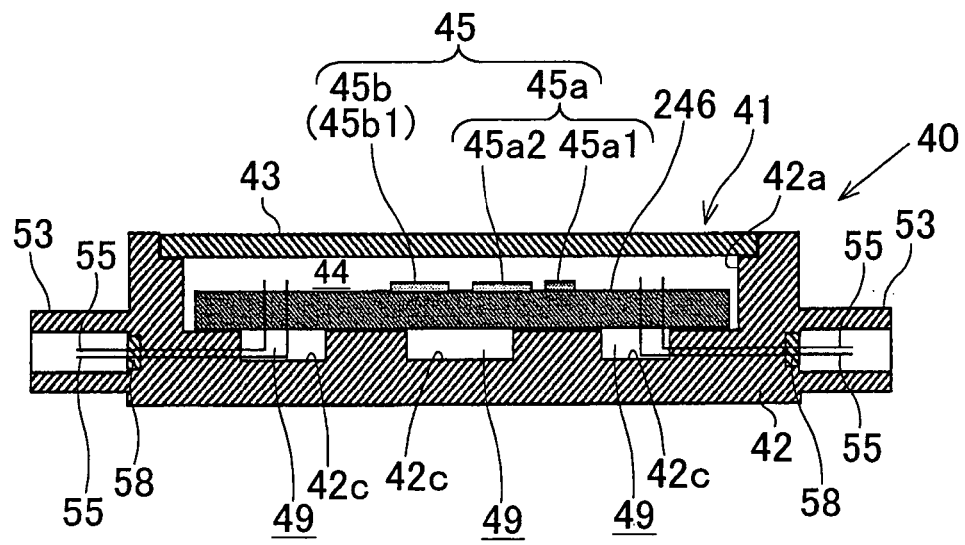
FIG. 14 is a sectional view of an automatic transmission electronic control device of a sixth embodiment of the present invention.

Next, an automatic transmission electronic control device in accordance with a sixth embodiment of the present invention will be described with reference to FIG. 14. The sixth embodiment includes a substrate 246 which integrates the metal substrate 154 of the fifth embodiment with the substrate 46. Similar to the substrate 46, an upper surface of this integrated substrate 246 supports an electronic circuit 45, and pins 55 are soldered to the substrate 246. The electronic circuit 45 and the pins 55 are electrically connected by patterns disposed on the upper surface of the substrate 246.

The substrate 246 is mounted in contact with the bottom of recess 42a which defines in part the enclosure 41. It is preferred that the substrate 246 be adhered to the bottom surface of the recess 42a (the attachment surface on the enclosure 41) by an insulating adhesive. The bottom surface of the recess 42a is provided, in turn, with recesses 42c. The recesses 42c and the substrate 246 define spaces 49 therebetween. The heat conductivity of the enclosure 41 is lower than the heat conductivity of the substrate 246, which serves as a heat dissipating element.

According to the sixth embodiment, the substrate 46, on which the electronic circuit 45 for operating the automatic transmission A is formed, is mounted in the casing 20 sealed liquid-tight within enclosure 41 formed of a material having a low heat conductivity, and the heat produced by the electronic circuit 45 is dissipated via the substrate 246 and the enclosure 41 (body 42). Therefore, in the case where, during operation of the automatic transmission A, the temperature of the electronic circuit 45 rises to a temperature higher than that of the ambient temperature of the ECU 40, that is, the temperature of the casing 20 interior, heat produced by the electronic circuit 45 is dissipated via the substrate 246 and the enclosure 41 so as to curb rise in the temperature of the electronic circuit 45 and to prevent its temperature from exceeding the service temperature range. Again, immediately after operation of the automatic transmission A is stopped, the operating fluid (ATF) whose temperature has become higher than its temperature during operation, flows in from the components which operate at high-temperature, such as the torque converter 31, the oil pump 32, etc., and therefore rapidly raises the temperature of the ECU 40 and results in a thermal overshoot, which thermal overshoot is absorbed by the enclosure 41 so that a rapid rise in the temperature of the electronic circuit 45 is avoided and the service temperature range is not exceeded since the electronic circuit 45 is surrounded by the enclosure 41 formed of a material having a low heat conductivity. Therefore, reliability can be maintained at low cost with a simple structure by maintaining the temperature of the electronic circuit 45 within the conventional service temperature range to the extent possible.

Furthermore, the substrate 246 is formed of a metal that has a heat dissipating characteristic, and is attached in contact with the bottom surface of the recess 42a, that is, an inner wall surface of the enclosure 41, so that heat produced by the electronic circuit 45 is dissipated via the enclosure 41. Therefore, with a simple structure, heat produced by the electronic circuit 45 can be dissipated via the enclosure 41 to the operating fluid (ATF) contained in the casing 20 and which surrounds the enclosure 41a.

Because the substrate 246 is adhered to an attachment surface of the enclosure 41 by an adhesive having low heat conductivity, it is possible to easily fix the substrate 246 to the enclosure 41 while maintaining low heat conduction from the enclosure 41 to the substrate 246, which serves as a heat dissipating member.

Furthermore, the use of the substrate 246 allows an even greater cost reduction than in the fifth embodiment.

In the foregoing sixth embodiment, the substrate 246 may also be fixed to attachment surfaces of the enclosure 41 through an intervening member formed of a material having low heat conductivity. This also reduces the heat conduction from the enclosure 41 to the substrate 246, and more effectively insulates the electronic circuit 45 from heat, when the temperature of the electronic control device 40 rises rapidly and results in a thermal overshoot.

Seventh Embodiment

Figure 15:
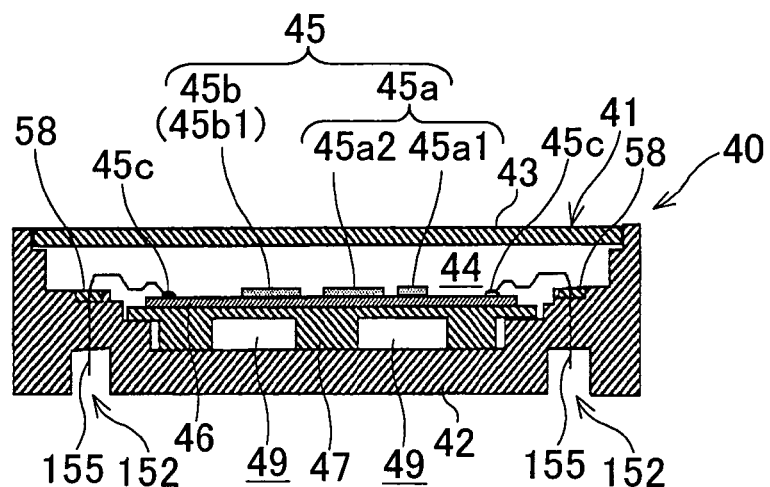
FIG. 15 is a sectional view of an automatic transmission electronic control device of a seventh embodiment of the present invention.

Next, an automatic transmission electronic control device in accordance with a seventh embodiment of the present invention will be described with reference to FIG. 15. Unlike the foregoing embodiments in which the pins (leads) 55 extend parallel to the case (the right-to-left directions in FIG. 2 or in a direction perpendicular to the sheet of the drawing) and the connectors 52 are provided on outer surfaces of side walls of the enclosure 41, the seventh embodiment has a structure in which leads 155 extend perpendicular to the major surfaces of the case (the top-tobottom direction in FIG. 2) and connectors 152 are provided as recesses in the bottom exterior surface of body 41 (or an upper surface of a cover 43) of an enclosure 41. Features of the seventh embodiment that are substantially the same as those of the first embodiment are represented by the same reference numerals, and again, only those features which are different will be described.

End portions of the leads 155 protrude inside the connector recesses 152. Each lead 155 extends through the body 42 in a direction perpendicular to the case, and an end thereof protrudes into the connector recess 152, and a protruding portion of the opposite end is appropriately bent and its distal end is joined to a corresponding pad 45c (e.g., by soldering) so as to establish an electrical connection. Incidentally, the leads 155 are sealed from the ATF by a potting material 58 as shown in FIG. 15. Furthermore, the relay substrate 54 of the first embodiment is omitted, and the substrate 46 is made broader.

According to this seventh embodiment, since the connecting portions (the above-described connector recesses 152) provided for connecting the automatic transmission electronic control device (ECU) 40 and other electronic components (electromagnetic valves) connect perpendicular to the case, rather than parallel thereto as in the previously described embodiments, the installation space required for the automatic transmission electronic control device (ECU) 40 can be correspondingly reduced.

Eighth Embodiment

Figure 16:
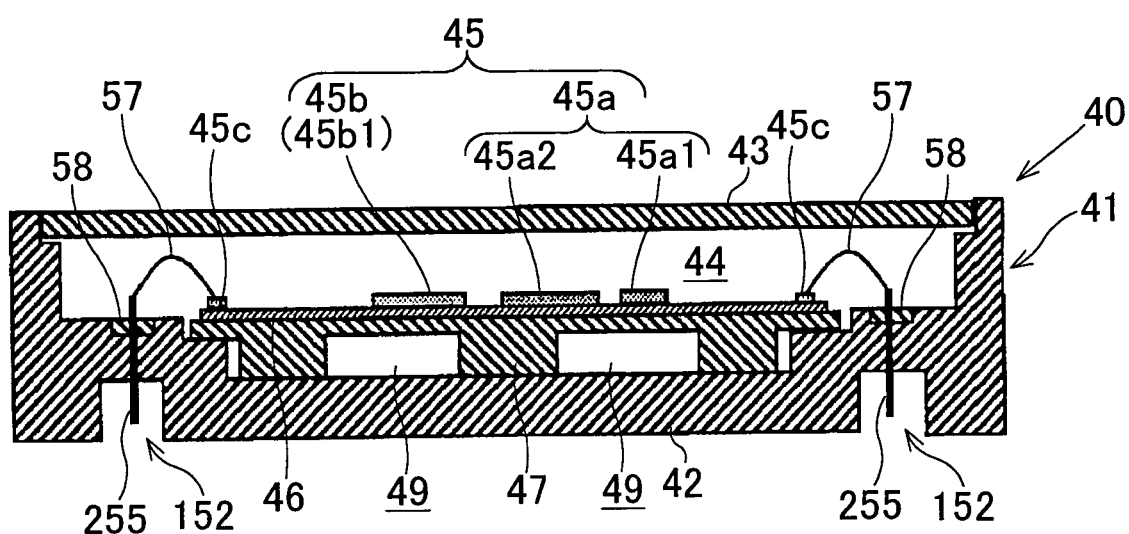
FIG. 16 is a sectional view of an automatic transmission electronic control device of an eighth embodiment of the present invention.

Next, an automatic transmission electronic control device in accordance with an eighth embodiment of the present invention will be described with reference to FIG. 16. Similar to the seventh embodiment, the eighth embodiment has a structure in which leads 255 extend perpendicular to the case (top-to-bottom direction in FIG. 2) and connector recesses 152 are provided in the bottom exterior of body 41 (or in the upper exterior surface of cover 43) of enclosure 41, unlike the foregoing first through sixth embodiments in which the pins (leads) 55 extend in parallel to the case (the right-to-left direction in FIG. 2 or in the direction perpendicular to the sheet of the drawing) and the connectors 52 are provided in outer surfaces of side walls of the enclosure 41. Features of the eighth embodiment that are substantially the same as those of the seventh embodiment are represented by the same reference numerals, and description thereof will not repeated, i.e., only those features which are different will be described.

Each lead 255 extends through the body 42 in a direction perpendicular to the case, and one end thereof protrudes inside the connector recess 152, and the other end protrudes inside housing chamber 44 where it is electrically joined with an end of one of wires 57. The other end of the wire 57 is joined by wire bonding to a corresponding pad 45c.

According to the eighth embodiment, too, since the connecting portions (the above-described connector recesses 152) provided for connecting the automatic transmission electronic control device (ECU) 40 and other electronic components (e.g., electromagnetic valves) connect perpendicular to the case, rather than parallel thereto, the installation space required for the automatic transmission electronic control device (ECU) 40 can be correspondingly reduced.

Although in the foregoing embodiments, the enclosure 41 is integrally formed of a material having low heat conductivity, the invention is not so limited. For example, the heat conductivity of the enclosure 41 may be reduced by surface treatment of the enclosure 41, or making a structural modification of the enclosure 41, etc.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. An automatic transmission electronic control device comprising:
   a substrate that is attached to a casing of an automatic transmission and supports an electronic circuit for controlling the automatic transmission;
   an enclosure which is provided within the casing, which is formed of a material having a low heat conductivity, and which provides a liquid-tight environment containing the substrate; and
   a heat sink having a first surface that is attached to and in contact with one surface of the substrate and a second surface, opposing the first surface, that is attached to and in contact with an inner wall surface of the enclosure so as to dissipate heat from the electronic circuit via the enclosure.

2. The automatic transmission electronic control device according to claim 1, wherein the heat sink is adhered to the inner wall surface of the enclosure via an adhesive having a low heat conductivity.

3. The automatic transmission electronic control device according to claim 1, wherein the enclosure is disposed at a position spaced from and thereby thermally isolated from high-temperature operating components of the automatic transmission.

4. The automatic transmission electronic control device according to claim 1, wherein the heat sink is insert-molded in the inner wall surface of the enclosure.

5. The automatic transmission electronic control device according to claim 4, wherein the enclosure is disposed at a position that is spaced from and thereby thermally isolated from the high-temperature operating components of the automatic transmission.

6. The automatic transmission electronic control device according to claim 1, wherein the heat sink is fixed to the inner wall surface of the enclosure via a member formed of a material having a low heat conductivity.

7. The automatic transmission electronic control device according to claim 6, wherein the enclosure is disposed at a position that is spaced from and thereby thermally isolated from high-temperature operating components of the automatic transmission.

8. The automatic transmission electronic control device according to claim 4, wherein the enclosure is disposed at a position that is spaced from and thereby thermally isolated from a high-temperature operating portion of the automatic transmission.

9. The automatic transmission electronic control device according to claim 1 wherein the heat sink is a planar member and wherein the one surface of the substrate, the first and second surfaces of the heat sink and the inner wall surface of the enclosure are parallel with each other.

10. The automatic transmission electronic control device according to claim 1 wherein one of the second surface of the heat sink and the inner wall surface of the enclosure have recesses and whereby the heat sink and the inner wall surface of the enclosure together define spaces open to a housing chamber defined by inner wall surfaces of the enclosure.

11. An automatic transmission electronic control device comprising:
- a substrate that is attached to a casing of an automatic transmission and supports an electronic circuit for controlling the automatic transmission;
- an enclosure which is provided in the casing and which provides a liquid-tight environment containing the substrate;
- a heat sink having a first surface in contact with an inner wall surface of the enclosure and a second surface, opposing the first surface, in contact with one surface of the substrate so as to dissipate heat produced by the electronic circuit; and wherein the heat conductivity of the enclosure is lower than the heat conductivity of the heat sink.

12. The automatic transmission electronic control device according to claim 11 wherein the heat sink is a planar member and wherein the one surface of the substrate, the first and second surfaces of the heat sink and the inner wall surface of the enclosure are parallel with each other.

13. The automatic transmission electronic control device according to claim 12 wherein one of the second surface of the heat sink and the inner wall surface of the enclosure have recesses and whereby the heat sink and the inner wall surface of the enclosure together define spaces open to a housing chamber defined by inner wall surfaces of the enclosure.

14. The automatic transmission electronic control device according to claim 11 wherein one of the second surface of the heat sink and the inner wall surface of the enclosure have recesses and whereby the heat sink and the inner wall surface of the enclosure together define spaces open to a housing chamber defined by inner wall surfaces of the enclosure.

15. The automatic transmission electronic control device according to claim 9 wherein one of the second surface of the heat sink and the inner wall surface of the enclosure have recesses and whereby the heat sink and the inner wall surface of the enclosure together define spaces open to a housing chamber defined by inner wall surfaces of the enclosure.

* * * * *